(12) United States Patent
Wu et al.

(10) Patent No.: US 6,861,176 B2
(45) Date of Patent: Mar. 1, 2005

(54) HOLE FORMING BY CROSS-SHAPE IMAGE EXPOSURE

(75) Inventors: Tsung-Hsien Wu, Hsinchu (TW); Ching-Yu Chang, Yilan Hsien (TW); Tahorng Yang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 246 days.

(21) Appl. No.: 10/065,003

(22) Filed: Sep. 9, 2002

(65) Prior Publication Data

US 2004/0048469 A1 Mar. 11, 2004

(51) Int. Cl.[7] .............................. G03F 9/00; G03C 5/00
(52) U.S. Cl. .......................... 430/5; 430/313; 430/394
(58) Field of Search ........................... 430/5, 313–316, 430/394–396

(56) References Cited

U.S. PATENT DOCUMENTS

| 5,605,775 | A | * | 2/1997 | Watanabe | 430/5 |
| 5,610,754 | A | * | 3/1997 | Gheen et al. | 359/210 |
| 6,134,006 | A | * | 10/2000 | Telschow et al. | 356/503 |
| 6,544,695 | B2 | * | 4/2003 | Wang et al. | 430/5 |
| 6,573,029 | B1 | * | 6/2003 | Takeuchi | 430/313 |
| 2003/0104319 | A1 | * | 6/2003 | Lin et al. | 430/313 |

FOREIGN PATENT DOCUMENTS

| JP | S58-78151 | * | 11/1981 | G03F/1/00 |
| JP | 4-116849 | * | 4/1992 | H01L/21/78 |

* cited by examiner

Primary Examiner—Duy-Vu N. Deo
(74) Attorney, Agent, or Firm—Jianq Chyun IP Office

(57) ABSTRACT

A method of forming holes in a layer through a cross-shape image exposure. The method includes removing a section from each corner of the rectangular patterns on a photomask to form cross-shape patterns so that circular or elliptical contact holes are formed on a photoresist layer after photo-exposure and development. Optical image contrast between contacts is increased by the cross-shape patterns on the photomask.

13 Claims, 4 Drawing Sheets

HOLE FORMING BY CROSS-SHAPE IMAGE EXPOSURE

BACKGROUND OF INVENTION

1. Field of Invention

The present invention relates to a method of forming holes. More particularly, the present invention relates to a method of forming holes in a layer through a cross-shape image exposure.

2. Description of Related Art

In recent years, many semiconductor manufacturers design circuit devices with the specific aim of miniaturization. One very important process in semiconductor production is photolithography. Size of critical dimension (CD) in many semiconductor device structures such as various thin film patterns depends on photolithographic processes. In other words, photolithographic process has tremendous impact the future development of semiconductor devices. The transfer of pattern through photomask is especially important because inaccuracy in pattern transfer is likely to affect tolerance of critical dimensions on a chip and lower exposure resolution.

When a pattern on a photomask is transferred to a chip, proximity effect is a factor that has the most effect on the precision of critical dimension on the surface of a chip. Proximity effect occurs when a beam of light passes through a patterned photomask to form an image on the chip. The beam of light passing through the photomask is subjected to diffraction so that the beam is optically distorted. In addition, the beam of light may pass through a photoresist layer on the surface of the chip and then back-reflect from the surface of the substrate leading to optical interference and double exposure. Consequently, the intensity of exposure picked up by the photoresist layer is likely to change. This phenomenon occurs most frequently when the line width is very close to the wavelength used in the light source.

At present, to form a circular or elliptical hole in a chip, a two-in-one exposure method is often used to overcome the aforementioned exposure problem. FIGS. 1A to 1C are schematic perspective views showing the steps for producing conventional holes on a chip.

As shown in FIG. 1A, a dielectric layer 102 is formed on a substrate 100. A photoresist layer 104 is formed over the dielectric layer 102. Thereafter, a first exposure is carried out using a first photomask (not shown) to form an image on the photoresist layer 104. The first photomask has a rectangular shaped pattern thereon. After photo-exposure of the first photomask, a first pattern 106 comprising of two corner-laid regions is transferred to the photoresist layer 104.

As shown in FIG. 1B, a second exposure is carried out using a second photomask (not shown) to form an image on the photoresist layer 104. Similarly, the second photomask has a rectangular shaped pattern thereon. After photo-exposure of the second photomask, a second pattern 108 comprising of two corner-laid regions is transferred to the photoresist layer 104. The first pattern 106 and the second pattern 108 are mirror images of each other.

As shown in FIG. 1C, photolithographic and etching processes are conducted to remove the dielectric layer 102 underneath the first pattern 106 and the second pattern 108. Finally, the photoresist layer 104 is removed to form holes 110 in the dielectric layer 102a.

However, the aforementioned method of forming holes may lead to a peeling of the photoresist layer 104 in a cylindrical region 112 (refer to FIG. 1B) between the first and the second pattern due to a leakage of light through the respective photomask in the first and the second photo-exposure. After etching, some defects may be produced in the dielectric layer 102a. To prevent such occurrences, a minimal distance between neighboring contact holes must be set. With the setting of a minimal distance between contact holes, a maximum pattern density is laid down preventing any further miniaturization of semiconductor devices.

SUMMARY OF INVENTION

Accordingly, one object of the present invention is to provide a method of forming holes in a layer through a cross-shape image exposure such that optical image contrast between contacts is improved.

A second object of this invention is to provide a method of forming holes in a layer through a cross-shape image exposure such that peeling of photoresist material between contacts is prevented.

A third object of this invention is to provide a method of forming holes in a layer through a cross-shape image exposure such that density of contacts can be increased.

A fourth object of this invention is to provide a method of forming holes in a layer through a cross-shape image exposure such that yield of silicon chip is increased.

To achieve these and other advantages and in accordance with the purpose of the invention, as embodied and broadly described herein, the invention provides a method of forming holes in a layer through a cross-shape image exposure. The method includes the following steps. A dielectric layer is formed over a semiconductor substrate and then a photoresist layer is formed over the dielectric layer. Thereafter, circular or elliptical contact opening patterns are formed on the photoresist layer by conducting a photo-exposure of a photomask having cross-shape patterns thereon instead of the conventional rectangular pattern. Hence, optical image contrast between the contacts is improved.

In this invention, cross-shape patterns are formed on the photomask surface. The method not only is simpler than a conventional two-in-one exposure method of forming contacts, but also has a bigger optical image contrast between the contacts for preventing unnecessary peeling of photoresist material between the contacts. Ultimately, denser and more accurately positioned contacts are fabricated leading to a higher overall product yield.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1A:
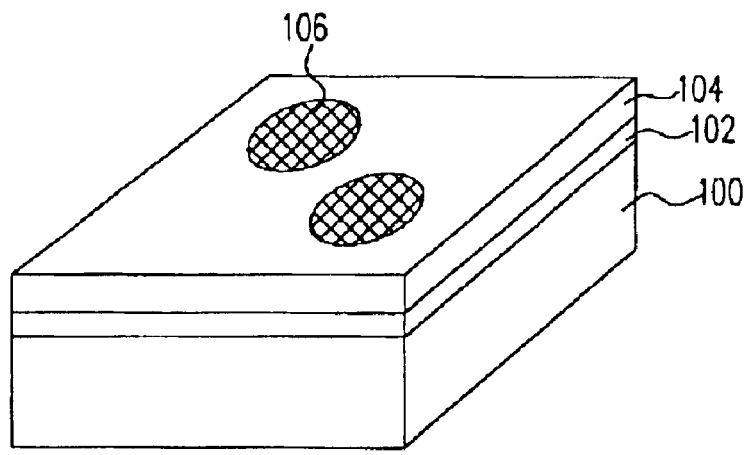
FIGS. 1A to 1C are schematic perspective views showing the steps for producing conventional holes on a chip.
Figure 1B:
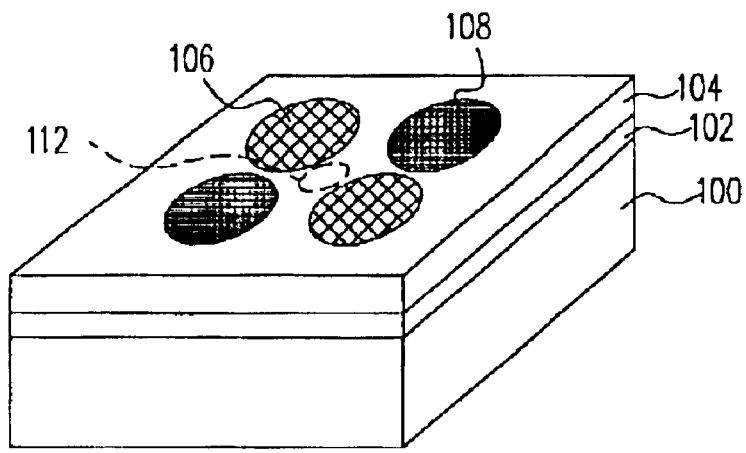
Figure 1C:
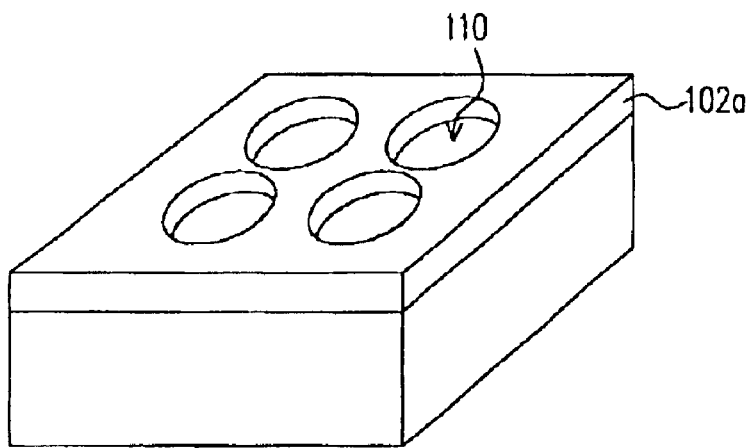

Reference will now be made in detail to the present preferred embodiments of the invention, examples of which are illustrated in the accompanying drawings. Wherever possible, the same reference numbers are used in the drawings and the description to refer to the same or like parts.

Figure 2:
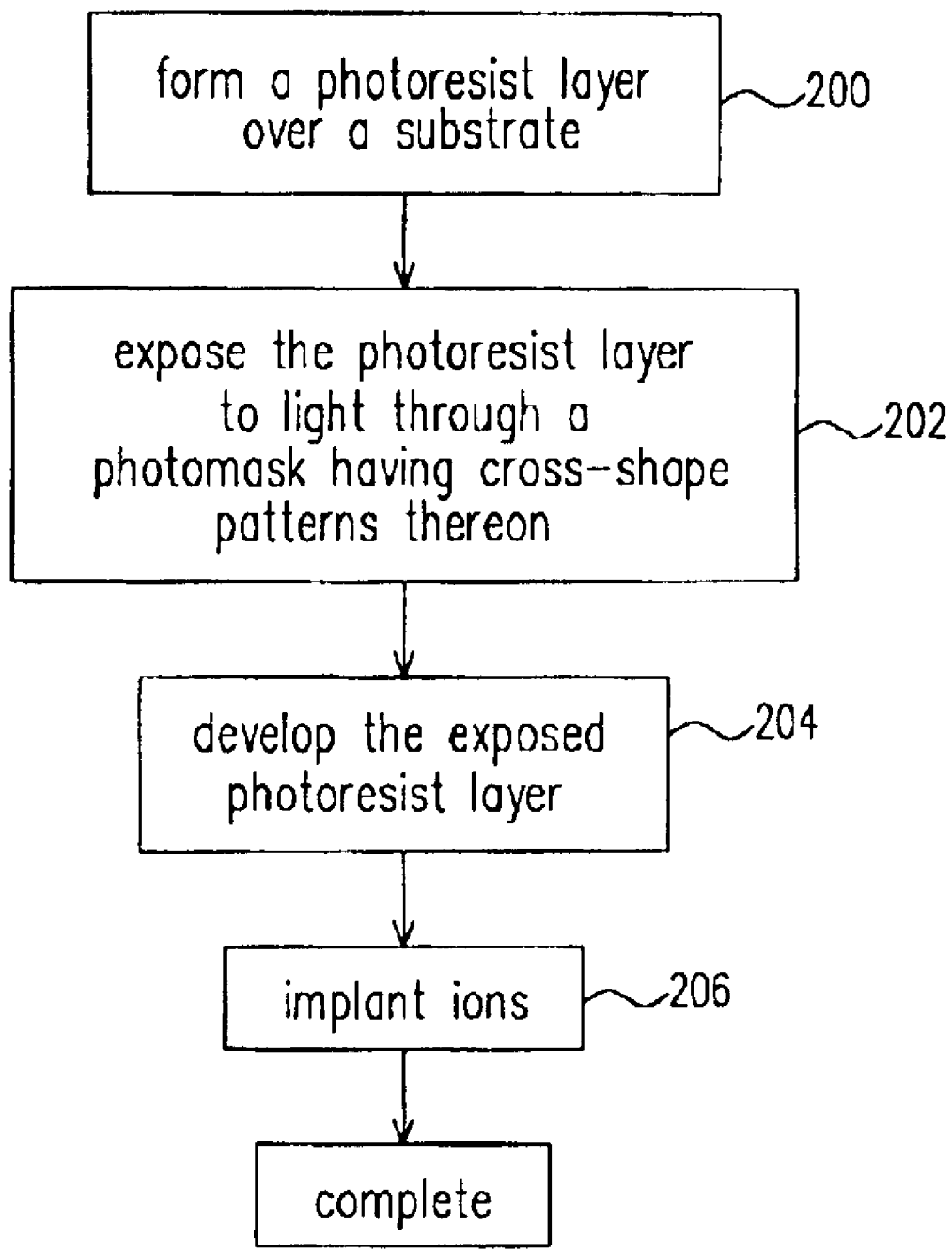
FIG. 2 is a flow chart showing the steps for forming holes in a layer through a cross-shape image exposure according to one preferred embodiment of this invention.

FIG. 2 is a flow chart showing the steps for forming holes in a layer through a a regular image with inwardly reduced corners, such as a cross-shape image exposure according to one preferred embodiment of this invention. In step 200, a photoresist layer is formed over a substrate. The substrate includes, for example, a semiconductor substrate, a semiconductor device, a conductive layer, a dielectric layer and so on. For example, a semiconductor device is formed over a semiconductor substrate and then a conductive layer that connects electrically with the semiconductor device is formed over the semiconductor substrate. A dielectric layer is formed over the semiconductor substrate covering the semiconductor device and the conductive layer. The dielectric layer is planarized and then a photoresist layer is formed over the planarized dielectric layer.

In step 202, a photomask having cross-shape patterns thereon is used to conduct a photo-exposure of the photoresist layer. The photomask has cross-shape pattern for forming circular or elliptical contact holes after a photo-exposure and chemical development. These cross-shape patterns are set up by a pair of opposing cross-shape patterns in two pairs, in which each pair of the patterns needs one photo exposure. In this manner, two times of photo exposure are performed for the two pairs in four patterns. Thus, this invention provides a method requiring a simpler arrangement. Furthermore, each cross-shape image patterns is formed by removing all the corners from a rectangular pattern. Hence, less light is likely to leak from the retracted corners of the cross-shape pattern than from perpendicular corners of a conventional pattern. In other words, optical image contrast between neighboring contacts is improved. As a result, peeling of photoresist material in the area between contacts after chemical development and the formation of defective holes after etching is less likely.

In step 204, the exposed photoresist layer is chemically developed to form holes in the photoresist layer. In step 206, ions are implanted into the substrate. Thereafter the photoresist layer is removed. The method according to this invention can also be applied to the fabrication of contact holes and via holes. In other words, the substrate can be etched using the patterned photoresist layer as an etching mask to form contact holes or via holes. After the etching operation, the photoresist layer is removed and conductive material such metal is deposited into the contact holes or the via holes to form contacts or vias.

Aside from the aforementioned examples, the method according to this invention may also be applied to form circular or elliptical pattern through etching.

Figure 3A:
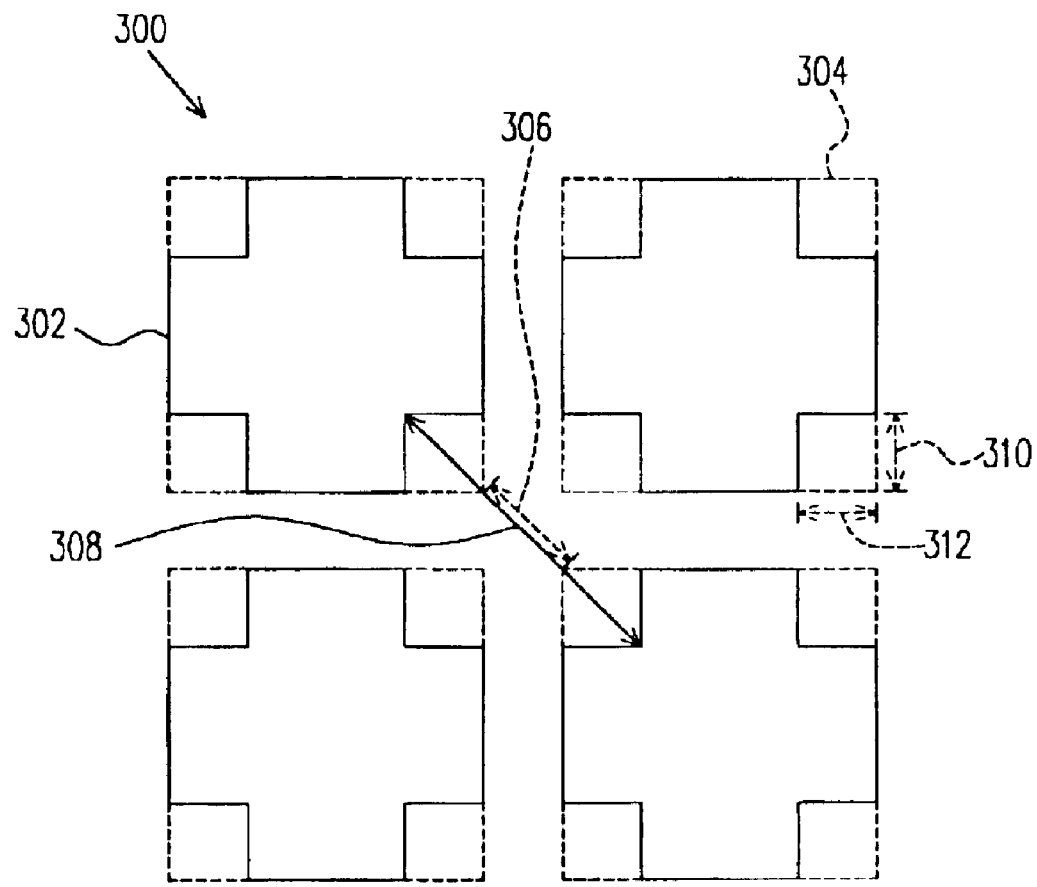
FIGS. 3A to 3B are top views showing the schematic layout of a cross-shape exposure image according to one preferred embodiment of this invention.

To explain major aspects of this invention, a top view showing the schematic layout of cross-shape exposure image according to one preferred embodiment of this invention is shown in FIG. 3A.

As shown in FIG. 3A, the photomask 300 for forming contact holes through photo-exposure is comprised of a plurality of cross-shape patterns 302. The cross-shape patterns 302 are organized into a pair of pair patterns. Because a conventional rectangular pattern 304 has a corner distance 306 far smaller than the corner distance 308 between the cross-shape patterns 302, this invention is able to prevent illumination leakage during photo-exposure that might lead to the peeling of the photoresist material between corner contact patterns. When peeling of the photoresist material is subdued, accuracy of ion implant is improved and the chance of producing defects in a subsequently formed dielectric pattern through etching is lowered. In this embodiment, the inward retractions 310 and 312 of the corners of cross-shape pattern 302 are, for example, at least 0.4 $\mu m$.

Figure 3B:
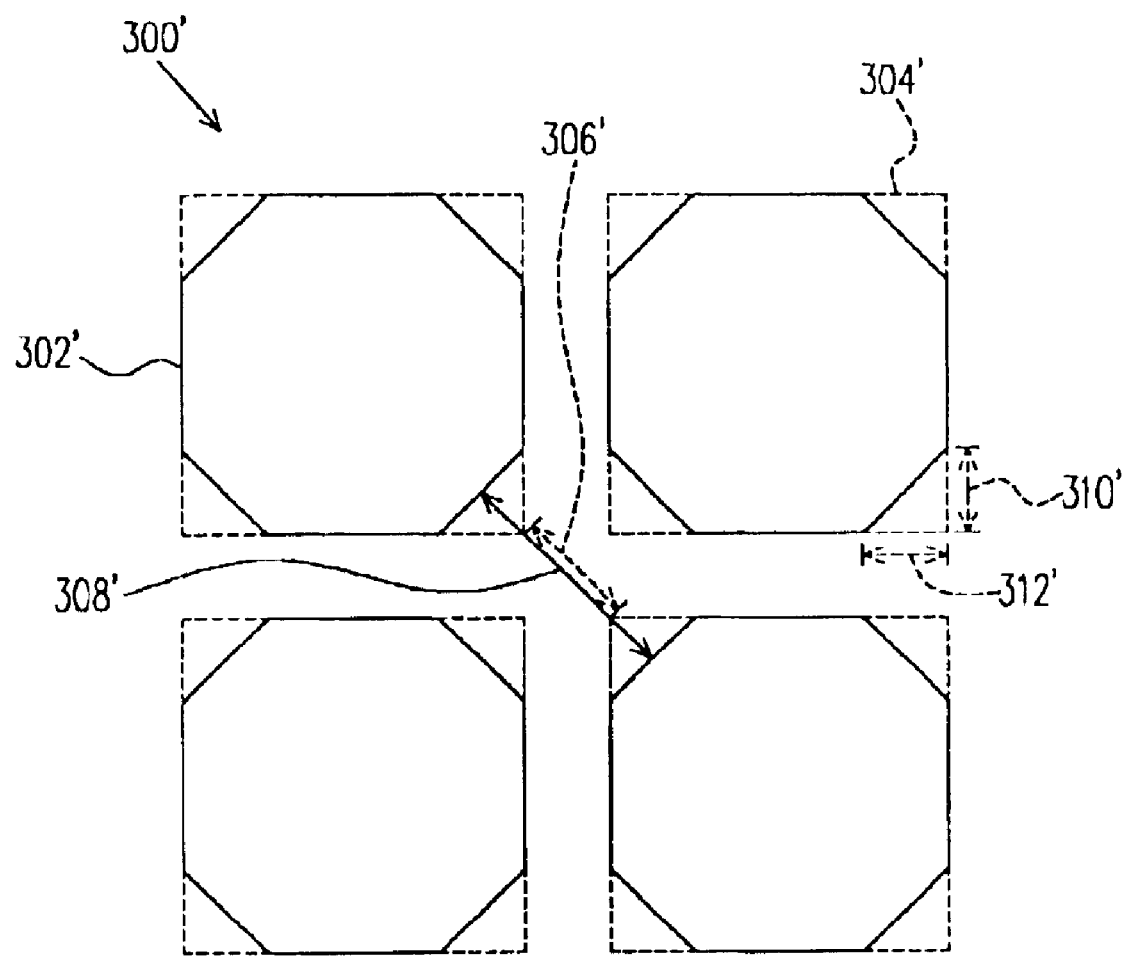

Another preferred embodiment of the invention is shown in FIG. 3B. The rectangular image with inwardly reduced corners is not necessary to be cross-shape as 302 of FIG. 3A. It can be formed as 302" of FIG. 3B, a corner-cut rectangular. The corners of the rectangular are cut to have a straight cutting side. However, the quantity of 310" and 312" can be chosen to decide the cutting side, which also results in the distance 308" between two against cutting sides.

In conclusion, major aspects of this invention includes:

1. Cross-shape patterns instead of rectangular patterns are formed on a photomask. Since the four right angles of a rectangular pattern has a larger total leakage area than the four retracted corners of a cross-shape pattern, optical image contrast between contacts is increased and hence the peeling of photoresist material between contacts is prevented.

2. The cross-shape patterns on the photomask are arranged in pairs of two opposite patterns, in which each pair needs only one time of photo exposure. In the example, two times of photo exposure are performed for the four patterns in two pairs. Hence, the method is much simpler to implement.

3. There is no need to set a minimum distance of separation between contacts due to possible peeling of the photoresist material. Thus, a denser contact pattern is possible.

4. After a chip has undergone photo-exposure and chemical development, the resulting product is likely to meet the required standard. With a reduction in product failure, product yield is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming holes in a photoresist layer over a substrate, comprising the steps of:

exposing the photoresist layer to light through a photomask, wherein the photomask has a plurality of repeated rectangular patterns with inwardly reduced corners having at least a straight cutting side thereon; and developing the photoresist layer to form holes.

2. The method of claim 1, wherein alter the step of developing the photoresist layer, further includes implanting ions into the substrate using the developed photoresist layer as a mask.

3. The method of claim 2 wherein after the step of implanting ions into the substrate, further includes removing the photoresist layer.

4. The method of claim 1, wherein the rectangular patterns with inwardly reduced corners on the photomask are suitable for exposing a positive photoresist layer.

5. The method of claim 1, wherein the rectangular patterns with inwardly reduced corners comprises a cross-shape pattern.

6. The method of claim 1, wherein the rectangular patterns with inwardly reduced corners comprises a pattern with cut corners.

7. A method of forming holes through a cross-shape image exposure, comprising the steps of:
- forming a photoresist layer over a semiconductor substrate;
- conducting an exposure using a photomask having a plurality of cross-shape patterns thereon;
- developing the exposed photoresist layer to form a plurality of holes and exposing a portion of the dielectric layer; and
- implanting ions into the semiconductor substrate using the developed photoresist layer as a mask.

8. The method of claim 7, wherein after the step of implanting ions into the semiconductor substrate, further includes removing the photoresist layer.

9. The method of claim 7, wherein the cross-shape patterns on the photomask are suitable for exposing a positive photoresist layer.

10. A method of forming contact holes through a cross-shape image exposure, comprising the steps of:
- forming a semiconductor device over a semiconductor substrate;
- forming a conductive layer over the semiconductor substrate, wherein the conductive layer is electrically connected to the semiconductor device;
- forming a dielectric layer over the semiconductor substrate, wherein the dielectric layer covers the semiconductor device and the conductive layer;
- forming a photoresist layer over the dielectric layer;
- conducting a photo-exposure using a photomask having a plurality of cross-shape patterns thereon;
- developing the photoresist layer to form a plurality of holes; and
- etching the dielectric layer using the developed photoresist layer as an etching mask to form a plurality of contact holes that exposes the conductive layer.

11. The method of claim 10, wherein the cross-shape patterns on the photomask are suitable for exposing a positive photoresist layer.

12. The method or claim 10, wherein after the step of etching the dielectric layer, further includes removing the photoresist layer.

13. The method of claim 10, wherein after the step of forming a dielectric layer over the semiconductor substrate, further includes planarizing the dielectric layer.

* * * * *